United States Patent
Srinivasan

(10) Patent No.: US 7,226,666 B2
(45) Date of Patent: Jun. 5, 2007

(54) MAGNETOELECTRIC EFFECTS OF MAGNETOSTRICTIVE AND PIEZOELECTRIC LAYERED COMPOSITES

(75) Inventor: Gopalan Srinivasan, Rochester, MI (US)

(73) Assignee: Oakland University, Rochester, MI (US)

( * ) Notice: Subject to any disclaimer, the term of this patent is extended or adjusted under 35 U.S.C. 154(b) by 219 days.

(21) Appl. No.: 10/354,863

(22) Filed: Jan. 30, 2003

(65) Prior Publication Data

US 2004/0021397 A1 Feb. 5, 2004

Related U.S. Application Data

(60) Provisional application No. 60/354,406, filed on Feb. 4, 2002.

(51) Int. Cl.
*B22F 7/02* (2006.01)
*B32B 15/04* (2006.01)

(52) U.S. Cl. ............... 428/548; 428/692.1; 428/693.1; 428/702; 310/311

(58) Field of Classification Search ............ 428/693.1
See application file for complete search history.

(56) References Cited

U.S. PATENT DOCUMENTS 4,769,599 A 9/1988 Mermelstein
4,803,392 A * 2/1989 Kushida et al. ............. 310/311
5,130,654 A 7/1992 Mermelstein
5,512,196 A 4/1996 Mantese et al.
5,675,252 A 10/1997 Podney (Continued)

OTHER PUBLICATIONS

Email from Gopalan Srinivasen to Ranald Hansen, Dated Nov. 20, 2001.*
Astrov, D.N., Soviet Phys. JETP 13 729 (1961).
Rado, G.T., et al., Phys. Rev. Lett. 7 310 (1961).
Foner, S., et al., J. Appl. Phys. 34 1246 (1963).
Kornev, I., et al., Phys. Rev. B 62 12247 (2000).
Van Suchtelen, Philips Res. Rep., 27 28 (1972).
Van den Boomgaard, J., et al., J. Mater. Sci. 9 1705 (1974).
Van den Boomgaard, J., et al., Ferroelectrics 14 727 (1976).
Van den Boomgaard, J., et al., J. Mater. Sci. 13 1538 (1978).
Harshe, G., et al., Int. J. App Electromag. Mater. 4 145 (1993).
Avellaneda, M., et al., J. Intell. Mater. Sys. Struc. 5 501 (1994).

(Continued)

*Primary Examiner*—Holly Rickman
(74) *Attorney, Agent, or Firm*—Ian C. McLeod; Steven E. Merritt

(57) ABSTRACT

An improved magnetoelectric composite which incorporates LaSrMn or LaCaMn oxides as a magnetostrictive composition are described. The magnetostrictive composition preferably has the formula $La_{0.7}Sr_{0.3}MnO_3$ or $La_{0.7}Ca_{0.3}MnO_3$. The composites preferably have a magnetostrictive layer joined to a piezoelectric layer. The composites are useful for sensors, read-heads, storage media and high frequency transducer devices.

13 Claims, 9 Drawing Sheets

U.S. PATENT DOCUMENTS

| | | | |
|---|---|---|---|
| 5,856,770 | A | 1/1999 | Mantese et al. |
| 6,190,925 | B1* | 2/2001 | Li et al. ............... 438/3 |
| 6,279,406 | B1 | 8/2001 | Li et al. |
| 6,387,476 | B1* | 5/2002 | Iwasaki et al. ........ 428/212 |
| 2001/0028245 | A1 | 10/2001 | Li et al. |
| 2001/0040450 | A1 | 11/2001 | Li et al. |

OTHER PUBLICATIONS

Harshe, G., Magnetoelectric effect in piezo-electric effect in piezo-electric-magnetostrictive composites, PhD Thesis. The Pennsylvania State University, College Park, PA (1991).

Srinivasan, G., et al., Phys. Rev. B 64 214408 (2001).

Ryu, J., et al., Jpn. J. Appl. Phys. 40 4948 (2001).

Bichurin, M.I., et al., Phys. Rev. B, 64 094409 (2001).

Ramirez, A.P., J. Phys.: Condens. Mater 9 8171 (1997).

Wood, V.E., et al., Proc. Symposium on Magneto-electric Interaction Phenomena in Crystals, Seattle, May 21, 24, (1973), eds. A.J. Freeman and H.Schmid, Gordon and Breach Science Publishers, New York . 181 (1975).

Piezoelectric ceramics materials properties, document code 13085, American piezo Ceramics, Inc. Mackeyville, PA (1998).

Arnold, Z., et al., Appl.Phys. Lett. 67 2875 (1995).

Haghiri-Gosnet, A.M., et al., J. Appl. Phys. 88 4257 (2000).

Chen, C.-C., et al., Appl. Phys. A 66, S1181 (1998).

* cited by examiner

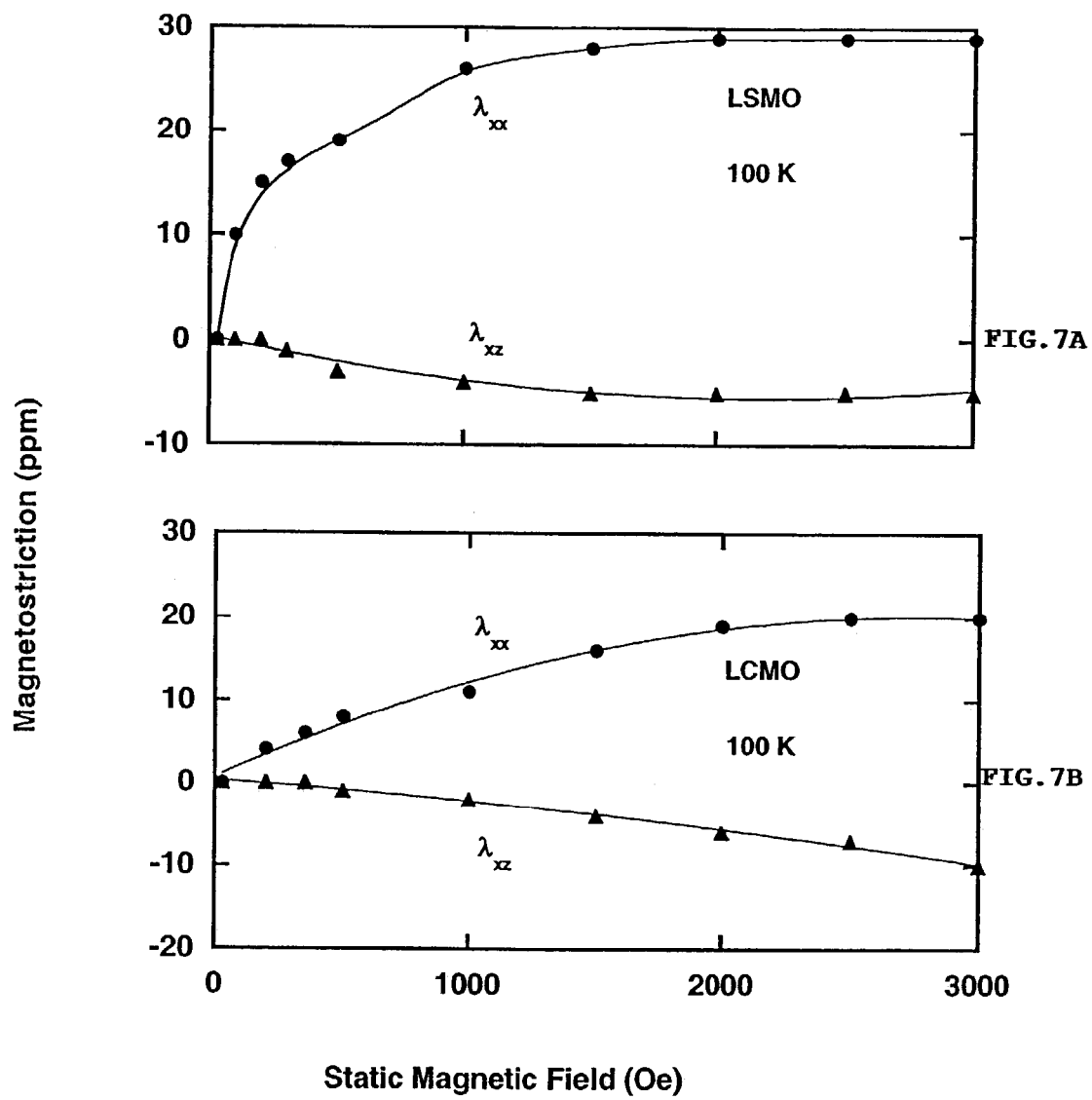

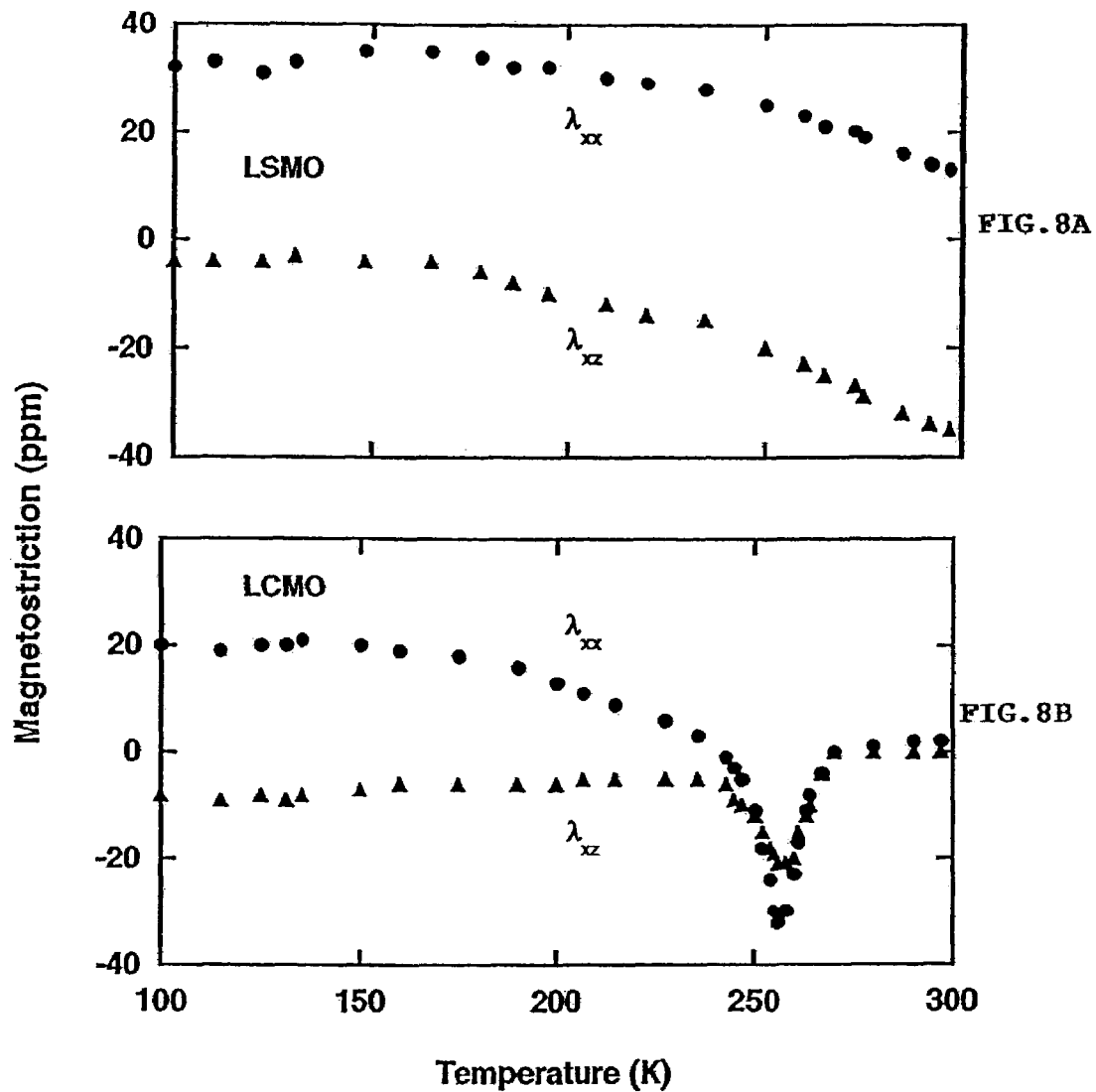

MAGNETOELECTRIC EFFECTS OF MAGNETOSTRICTIVE AND PIEZOELECTRIC LAYERED COMPOSITES

CROSS REFERENCE TO RELATES APPLICATIONS

This applications claims priority to U.S. Provisional Application Ser. No. 60/354,406, filed Feb. 4, 2002.

GOVERNMENT RIGHTS

The invention disclosed in this application was supported by the National Science Foundation Grant No. DMR-0072144. The U.S. government has certain rights to this invention.

BACKGROUND OF THE INVENTION (1) Field of the Invention

The present invention relates to magnetoelectric composites and method for preparation thereof which incorporate lanthanum manganese strontium (LaSrMn) oxides or lanthanum manganese calium (LaCaMn) oxides as the magnetostrictive composition in the composite. The composites are in layers, with layers of piezoelectric compositions.

(2) Description of Related Art

In a single-phase material, ME effects require long range ordering of atomic moments and electric dipoles. There are few such material and the effect is often weak (Astrov, D. N., Soviet phys. JETP 13 729 (1961); Rado, G. T., et al., Phys. Rev. Lett. 7, 310 (1961); Foner, S., et al., J. Appl. Phys. 34 1246 (1963); and Kornev, I., et al., Phys. Rev. B 62, 12247 (2000)). For the engineering of materials with new or improved properties Van Suchtelen proposed product-property composites (Van Suchtelen, Philips Res. Rep., 27, 28 (1972)). For example, composites with magnetostrictive (m) and piezoelectric phases (p) are expected to be magnetoelectric because of mechanical stress mediated electromagnetic coupling. Most studies in the past focused exclusively on ferrite-PZT/BaTiO$_3$ composites. Van den Boomgaard synthesized bulk composites of CoFe$_2$O$_4$/NiFe$_2$O$_4$ and BaTiO$_3$ (Van den Boomgaard, J., et al., J. Mater. Sci. 9, 1705 (1974); Van den Boomgaard, J., et al., Ferroelectrics 14 727 (1976); and van den Boomgaard, J., et al., J. Mater. Sci. 13 1538 (1978)). The mixed oxides yielded ME coefficients much smaller than calculated values due to leakage currents through low resistivity ferrites and microcracks that resulted from mismatch of structural parameters and thermal properties. The problem with low resistivity ferrites can be eliminated in a layered structure. Theories predict a very large ME coefficient in a bilayer of p- and m-phases due to enhanced piezoelectricity, but measured values in CoFe$_2$O$_4$-PZT were small (Harshe, G., et al., Int. J. App Electromag. Mater. 4 145 (1993); Avellaneda, M., et al., J. Intell. Mater. Sys. Struc. 5, 501 (1994); and Harshe, G., *Magnetoelectric effect in piezoelectric-magnetostrictive composites*, PhD thesis. The Pennsylvania State University, College Park, Pa. (1991)). The inventor recently reported giant ME coefficients in bilayers and multilayers of nickel ferrite-PZT (Srinivasan, G., et al., Phys. Rev. B 64, 214408 (2001)), and a record high ME effect was reported very recently in trilayer composites of PZT with Terfenol-D (Ryu, J., et al., Jpn. J. Appl. Phys. 40, 4948 (2001)). The recent theoretical model for a ferrite-PZT bilayer predicts a strong ME effects at microwave frequencies (Bichurin, M. I., et al., Phys. Rev. B, 64 094409 (2001)). Lanthanum manganites with divalent substitutions have attracted considerable interest in recent years due to double exchange mediated ferromagnetism, metallic conductivity, and giant magnetoresistance (Ramirez, A. P., J. Phys.: Condens. Mater 9, 8171 (1997)). The manganites are potential candidates for ME composites because of (i) high magnetostriction and (ii) metallic conductivity that eliminates the need for a foreign electrode at the p-m interface.

The art of magnetoelectric composites is well developed as shown by U.S. Pat. Nos. 4,769,599 and 5,130,654 to Mermelstein, U.S. Pat. Nos. 5,512,196 and 5,856,770 to Mantese et al, U.S. Pat. No. 5,675,252 to Podney and U.S. Pat. No. 6,279,406 to Li et al. Additional art is shown in U.S. publications 2001/0040450 A1 and 2001/0028245 A1 to Li et al. What is apparent from this art is that while the concepts are well developed, the composites need an improvement in the magnetoelectric properties. All of these patents and applications are incorporated by reference herein.

OBJECTS

It is therefore an object of the present invention to provide improved magnetoelectric composites. It is further an object of the present invention to provide composites which are economical to prepare. These and other objects will become increasingly apparent by reference to the following description.

SUMMARY OF THE INVENTION

The present invention relates to a magnetoelectric laminate composite comprising in combination:

(a) a layer of a piezoelectric composition; and (b) a layer of a sintered La$_{1-n}$A$_n$MnO$_3$ magnetostrictive composition where A is selected from the group consisting of calcium, strontium and mixtures thereof and n is a number less than 1. A is strontium or calcium or mixtures thereof. The piezoelectric material is preferably lead zirconate titanate (PZT). One preferred magnetostrictive composition has the formula La$_{0.7}$Sr$_{0.3}$MnO$_3$. Another preferred magnetostrictive composition has the formula La$_{0.7}$Ca$_{0.3}$MnO$_2$.

The present invention also relates to a method for forming a magnetoelectric composite which comprises:

(a) sintering and milling mixture of lanthanum oxide, manganese oxide and a carbonate selected from the group consisting of calcium carbonate and strontium carbonate as a powder mixture which is precursor to a magnetostrictive composition;

(b) forming a cast (a fine suspension) of the mixture of step (a) with a solvent, binder, dispersant and a plasticizer;

(c) spreading the cast on a substrate, preferably mylar, to form a thick film layer;

(d) forming a composite of the layer of step (c) with a layer of a piezoelectric material; and (e) compressing and sintering the layers of step (d) to form the magnetoelectric composite. Preferably the magnetostrictive composition has the formula La$_{1-n}$Ca$_n$MnO$_3$ by using preselected molar amounts of the lanthanum oxide, the manganese oxide and the calcium carbonate, where n is a number less than 1. Also preferably the magnetostrictive composition has the formula La$_{1-n}$Sr$_n$MnO$_3$ by using preselected molar amounts of the lanthanum oxide, the manganese oxide and the strontium carbonate, where n is a number less than 1.

The present invention also relates to a method for generating an electric voltage which comprises:

(a) providing a magnetoelectric laminate composite comprising in combination:

a layer of a piezoelectric composition; and a layer of a sintered $La_{1-n} A_n MnO_3$ magnetostrictive composition where A is selected from the group consisting of calcium, strontium and mixtures thereof and n is a number less than 1; and (b) exposing the composite to a low energy magnetic field between 0.001 and 10 $kO_e$ so that the current is produced in the piezoelectric material.

The present invention also relates to a computer system with a memory device comprising a magnetoelectric laminate composite comprising as the memory device:

(a) a layer of a piezoelectric composition; and (b) a layer of a sintered $La_{1-n} A_n MnO_3$ magnetostrictive composition where A is selected from the group consisting of calcium, strontium and mixtures thereof and n is a number less than 1.

The present invention also relates to a system requiring a laminate sensor combining magnetic and magnetoelectric properties comprising as the sensor:

(a) a layer of a piezoelectric composition; and (b) a layer of a sintered $La_{1-n} A_n MnO_3$ magnetostrictive composition where A is selected from the group consisting of calcium, strontium and mixtures thereof and n is a number less than 1.

BRIEF DESCRIPTION OF DRAWINGS

FIGS. 7A and 7B are graphs showing magnetostriction λ versus static field H data at 100 K for LSMO and LCMO disks made of thick films obtained by tape casting. The measurements of in-plane λ along the x-axis were made for (i) H along x-direction: $\lambda_{xx}$, and (ii) H-along the z-direction (perpendicular to the sample plane): $\lambda_{xz}$. The lines are guides to the eye.

FIGS. 8A and 8B are graphs showing parallel (filled symbols) and perpendicular (open symbols) magnetostriction, $\lambda_{xx}$ and $\lambda_{xz}$, respectively, measured at 3 kOe as a function of temperature for LSMO (circles) and LCMO (triangles) disks.

DESCRIPTION OF PREFERRED EMBODIMENTS

Figures 1A, 1B:
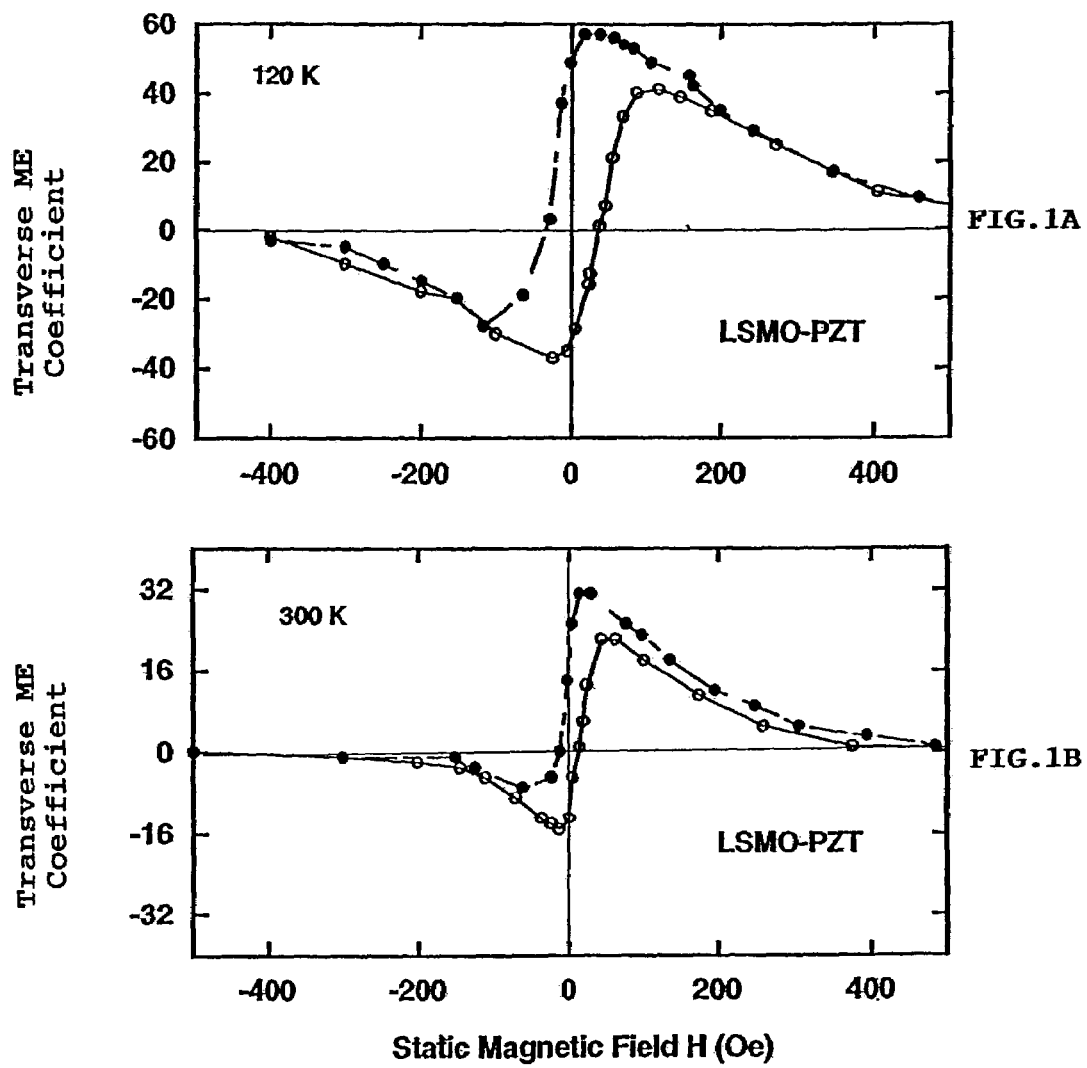
FIGS. 1A and 1B are graphs showing transverse magnetoelectric (ME) voltage coefficient $\alpha_{E,zx}=\delta E_z/\delta H_x$ at 120 K and 300 K as a function of static magnetic field H for a two-layer structure consisting of 200 μm films of lanthanum strontium manganite $La_{0.7}Sr_{0.3}MnO_3$ (LSMO) and lead zirconate titanate (PZT). The bias field H and a 100 Hz ac magnetic field $\delta H_x$ are applied parallel to each other and parallel to the sample plane and the induced electric field $\delta E_z$ is measured perpendicular to the sample plane. The open (filled) circles are the data points for increasing (decreasing) H. The lines are guides to the eye.

The following examples describe the preferred embodiments of this invention.

Materials that respond to both electric and magnetic fields are said to be magnetoelectric (ME) and facilitate field conversion. One way in principle to accomplish strong ME effects is a composite of magnetostrictive and piezoelectric materials in which the coupling is mediated by mechanical deformation. Novel multilayers of piezoelectric lead zirconate titanate (PZT) and lanthanum strontium or calcium manganite (LSMO)-PZT were synthesized. The multilayers synthesis involved the following steps: (i) preparation of thick films by tape casting, (ii) lamination to obtain the multilayer structure, and (iii) high temperature sintering.

The materials are preferably multilayer composites consisting of alternate layers of (1) a lanthanum strontium or calcium manganite (LSMO) sintered composition which deforms in a magnetic field and (2) a lead zirconate titanate (PZT) which generates electricity when deformed. Composites were made from thick films of the constituent layers prepared by tape-casting techniques. The films were then arranged to form the required multilayer structure, laminated and sintered at high temperature.

In the following examples, the observation of strong magnetoelectric effects is shown in layered composites of ferromagnetic lanthanum manganites and piezoelectric lead zirconate titanate (PZT). Studies were made on thick film structures of $La_{0.7}Sr_{0.3}MnO_3$ (LSMO)-PZT and $La_{0.7}Ca_{0.3}MnO_3$ (LCMO)-PZT. Low frequency magnetoelectric (ME) voltage coefficient $\alpha_E$ was measured in bilayers and multilayers synthesized by tape casting. The effect is stronger in LSMO-PZT than in LCMO-PZT, and is weaker in multilayers compared to bilayers. A maximum $\alpha_E$ of 60 mV/cm Oe is measured for the transverse ME effect and is a factor of 2–3 higher than the longitudinal effect. The bias magnetic field dependence of $\alpha_E$ shows hysteresis and remanence. A general increase in $\alpha_E$ is observed with increasing frequency or decreasing temperature. There is good qualitative agreement between theory and data for the magnetic field dependence of $\alpha_E$.

This invention is concerned with the synthesis and analysis of heterostructures of calcium or strontium substituted lanthanum manganites with lead zirconate titanate (PZT) and the observation of strong magnetoelectric effects. The ferromagnetic manganite is magnetostrictive and the ferroelectric PZT is piezoelectric. In a product-property composite of the two oxides, an applied ac magnetic field produces mechanical deformation resulting in a spin-electric dipole coupling and an ac electric field (Van Suchtelen, Philips Res. Rep. 27, 28 (1972); Van den Boomgaard, J., et al., J. Mater. Sci. 9, 1705 (1974); Van den Boomgaard, J., et al., Ferroelectrics 14, 727 (1976); van den Boomgaard, J., et al., J. Mater. Sci. 13, 1538 (1978); Harshe, G., et al., J. Appl. Electromag. Mater. 4, 145 (1993); Avellaneda, M., et al., J. Intell. Mater. Sys. Struc. 5, 501 (1994); and Harshe, G., *Magnetoelectric effect in piezoelectric-magnetostrictive composites,* PhD thesis, The Pennsylvania State University, College Park, Pa. (1991)). Such composites facilitate the conversion of energies between magnetic and electric fields and are potential candidates for use as ME memory elements, smart sensors, and transducers (Wood, V. E., et al., *Proc. Symposium on Magnetoelectric Interaction Phenomena in Crystals,* Seattle, May 21–24, (1973), eds. A. J. Freeman and H. Schmid, Gordon and Breach Science Publishers, New York p. 181 (1975)).

Strong ME effects and its unique magnetic field dependence are shown in composites of $La_{0.7}Sr_{0.3}MnO_3$ (LSMO)-PZT and $La_{0.7}Ca_{0.3}MnO_3$ (LCMO)-PZT. The oxide films were made by the tape casting technique and were laminated and sintered to obtain the required heterostructures. The ME voltage coefficient $\alpha_E$ measurements involved the response of a poled composite to an applied ac magnetic field in the presence of a bias magnetic field H. A relatively larger ME effect was observed in LSMO-PZT samples than in LCMO-PZT. The effect weakened in multilayers compared to bilayers. The highest value for the ME voltage coefficient $\alpha_E$ was 60 mV/cm Oe in bilayers of LSMO-PZT. For comparison, the best value in a single phase material was 20 mV/cm Oe for $Cr_2O_3$, and in composites 1500 mV/cm Oe for ferrite -PZT (Srinivasan, G., et al., Phys. Rev. B 64, 214408 (2001)), and 4680 mV/cm Oe for Terfenol-PZT (Ryu, J., et al., Jpn. J. Appl. Phys. 40, 4948 (2001)). Hysteresis and remanence was observed in the H dependence of $\alpha_E$. A 180 deg. phase difference is observed in the ME voltage when H is reversed. The dependence of $\alpha_E$ on composite and experimental such as the number of layers, relative orientations of electric and magnetic fields, frequency, and temperature are shown. Theoretical estimates based on a model for bilayers are in qualitative agreement with the data. The large ME voltage in conjunction with the remanence in the H dependence is the key ingredient for potential use of manganite-PZT composites in memory devices, read-head for storage media and smart sensors.

A theoretical model for a bilayer consisting of m- and p-layers is now discussed (Harshe, G., et al., Int. J. Appl. Electromag. Mater. 4, 145 (1993); Avellaneda, M., et al., J. Intell. Mater. Sys. Struc. 5 501 (1994); and Harshe, G., *Magnetoelectric effect in piezoelectric-magnetostrictive composites,* PhD thesis, The Pennsylvania State University, College Park, Pa. (1991)). The model is described hereinafter for comparison with data. The theory is based on the assumptions that no electric field is present in the m-layer, the top and bottom surfaces of the p-layer are equipotential surfaces and bias magnetic field H is uniform through out the sample. For the systems of interest, LSMO (LCMO)-PZT, the assumptions are valid because of low electrical resistivity for manganites. In addition, the layers are considered to be free bodies and interface coupling assumed to be ideal. Thus there cannot be any strain perpendicular to the sample plane. When the sample is subjected to an ac magnetic field $\delta H$, the m-phase will exhibit a linear pseudo-piezomagnetism (for appropriate bias magnetic field H) resulting in a strain q $\delta H$. Here q is the piezomagnetic coefficient and is determined from magnetostriction $\lambda$ for the bilayer. The elastic property relates this strain at the p-m interface to stress and is in turn converted to an induced electric field $\delta E$ in the p-phase through piezoelectric coupling. The polarization $P = \alpha H$, where $\alpha$ is the second rank ME-susceptibility tensor. The parameter that is measured in experiments is the ME voltage coefficient $\alpha_E = \delta E/\delta H$ with $\alpha = \epsilon_o \epsilon_r \alpha_E$, where $\epsilon_r$ is the relative permittivity. We assume a coordinate system with the sample in the (x,y) plane. The sample is poled with an electric field E along the z-direction. Detailed calculations yield the following expressions for the transverse ME voltage coefficient $\alpha_{E,zx}$ corresponding to H and $\delta H$ parallel to each other and along the x-axis and $\delta E$ measured along z; and the longitudinal coefficient $\alpha_{E,zz}$ corresponding to all the three fields along z (Harshe, G., et al., Int. J. Appl. Electromag. Mater. 4, 145 (1993); Avellaneda, M., et al., J. Intell. Mater. Sys. Struc. 5 501 (1994); and Harshe, G., *Magnetoelectric effect in piezoelectric-magnetostrictive composites,* PhD thesis, The Pennsylvania State University, College Park, Pa. (1991)).

$$\alpha_{E,zx} = \delta E_z/\delta H_x = \frac{-2\,^p d_{zx}{}^m q_{xx}{}^m V}{(^m s_{xx} + ^m s_{xy})^p \varepsilon_{zz}^{T,p} V + (^p s_{xx} + ^p s_{xy})^p \varepsilon_{zz}^{T,m} V - 2(^p d_{zx})^{2m} V} \quad (1)$$

$$\alpha_{E,zz} = \delta E_z/\delta H_z = \frac{-2\,^p d_{zx}{}^m q_{xx}{}^m V}{(^m s_{xx} + ^m s_{xy})^p \varepsilon_{zz}^{T,p} V + (^p s_{xx} + ^p s_{xy})^p \varepsilon_{zz}^{T,m} V - 2(^p d_{zx})^{2m} V}. \quad (2)$$

Here s and d are compliance and piezoelectric coefficients, respectively, v denotes the volume and $\epsilon^T$ is permitivity at constant stress. Since the electric field is uniform (assumed to be zero) over the MS layer, it is reasonable to define $\alpha_E$ for unit thickness of the p-phase, as in Eqs. (1) and (2). This model is used in Section 4 to estimate $\alpha_E$ and its H dependence.

EXAMPLES

The samples were prepared from thick films obtained by doctor blade techniques. Submicron LSMO (LCMO) powder and commercial PZT[14] were used. Fine powders of manganites were prepared by the standard ceramic technique. Oxides of La and Mn, and carbonate of Sr (Ca) were mixed in a ballmill, presintered at 1300 K and then sintered at 1550 K. Wet-ballmilling with methanol was carried out for 48 hrs to obtain submicron powders. The sample synthesis involved the preparation of tapes of manganites and PZT, lamination and final sintering. For tape casting, the powder was mixed with a solvent (ethly alcohol) and a dispersant (Blown Menhaden Fish Oil) and ballmilled for 24 hrs, followed by a second ball milling with a plasticizer (butyl benzyl phthalate) and a binder (polyvinyl butyral) for 24 hrs. The slurries thus obtained were cast into 20 μm thick films on silicon coated mylar sheets using a tape caster consisting of a pair of stationary blades and a moveable casting bed. The tapes were dried in air for 24 hrs, removed from the mylar substrates, and were then arranged to obtain the desired structures. The samples were compacted under high pressure (5000 psi) and high temperature (400 K), and heated at 800–900 K for binder evaporation. The final sintering was carried out at $T_s$=1250–1500 K for 1–2 hrs. Samples were made with equal number of manganite and PZT layers, with the total number of layers ranging from n=2 (bilayer) to 8. In all the samples the total thickness of both m- and p-phases remained the same. In the bilayer, both phases were of equal thickness, 200 μm each. In the multilayer sample with n=4, for example, the layer thickness was 100 μm.

X-ray diffraction was performed for structural characterization on composites and powdered samples. The diffraction pattern for powder samples sintered at 1250–1350 K contained reflections from LSMO (LCMO) and PZT phases. For higher $T_s$, impurity phases were present. These observations are in agreement with low temperature magnetization data that showed a reduction in the saturation magnetization for samples sintered at $T_s$=1350–1500 K and ferromagnetic resonance data that revealed line broadening. Thus samples sintered at high temperatures contained impurity phases that resulted from diffusion across the manganite-PZT interface. The data reported here are for the sample sintered at 1325 K, free of detectable amount of impurities and with the best magnetic parameters for LSMO (LCMO). Electrical contacts were made with silver paint and poling was done by heating the sample to 400 K and cooling in the presence of a 25 kV/cm electric field. The dielectric constant and the piezoelectric coupling constant for the composite were in agreement with expected values (*Piezoelectric ceramics materials properties,* document code 13085, American Piezo Ceramics, Inc., Mackeyville, Pa. (1998)).

The ME voltage coefficient $\alpha_E=\delta E/\delta H$ was measured by subjecting the sample to a bias field H and an ac field δH using an electromagnet fitted with a pair of Helmholtz coils (δH=0.1–10 Oe at 10 Hz–10 kHz). The induced electric field δE was estimated from the measured open circuit voltage across the sample. Both transverse ($\alpha_{E,zx}$) and longitudinal ($\alpha_{E,zz}$) ME coefficients were measured as a function of H, frequency, and temperature. A liquid-helium glass dewar and a nonmetallic sample insert were used for studies on temperature dependence of ME effects.

The best ME parameters are obtained at low temperatures for the bilayer sample. FIG. 1 shows the H dependence of the transverse coefficient $\alpha_{E,zx}$ for a bilayer (n=2) of $La_{0.7}Sr_{0.3}MnO_3$-PZT. The data are for temperatures 120 K and 300 K and for a frequency of 100 Hz for the ac magnetic field. Consider first the data at 120 K. As H is increased from −500 Oe, $\alpha_{E,zx}$ increases in magnitude and peaks at −35 Oe. One observes a large remanence at H=0. With further increase in H, $\alpha_{E,zx}$ goes through zero value at the coercive field $H_c$=35 Oe and is accompanied by a 180 deg. phase shift in the ME voltage. A peak in $\alpha_{E,zx}$ is evident at 140 Oe and it decreases gradually to zero with further increase in H. One essentially observes similar features for decreasing H, from 500 Oe to −500 Oe, but the peak is down shifted in H and the peak value is higher than for increasing fields. The most significant observations are the hysteresis and remanence in $\alpha_{E,zx}$ vs H. The loop is asymmetric with a squareness-ratio of well over 90%. When the sample temperature is increased to 300 K, one essentially observes similar features as for 120 K, but with the following departures: (i) a pronounced asymmetry in the hysteresis loop and a reduction in $H_c$, and (ii) an overall reduction in the magnitude of $\alpha_{E,zx}$.

Figure 2:
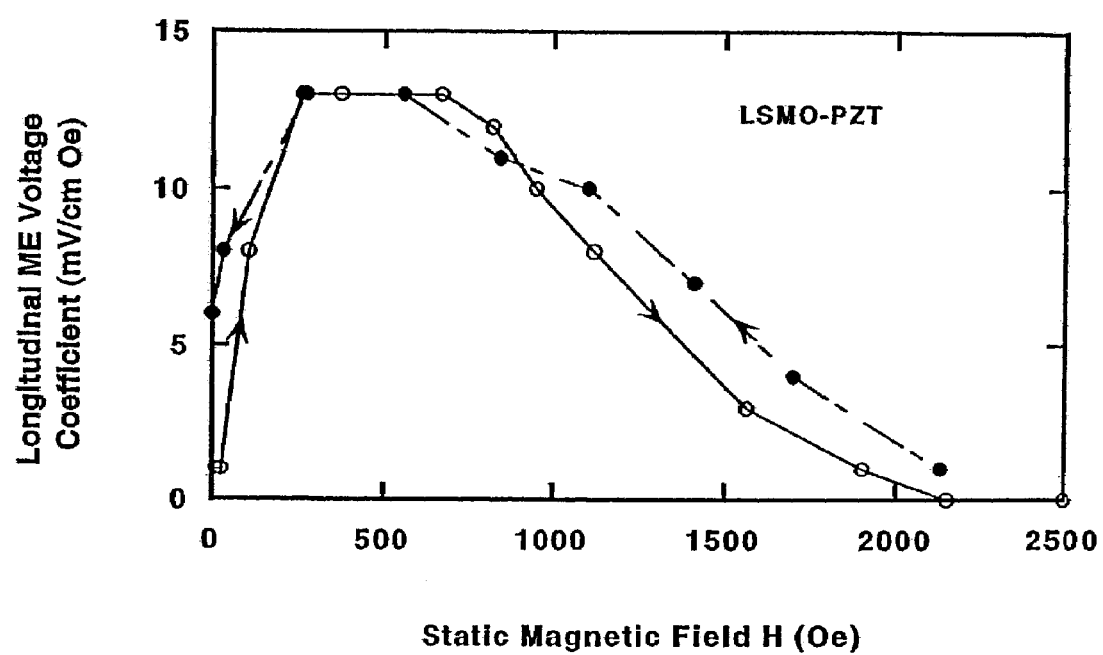
FIG. 2 is a graph showing static field dependence of room temperature longitudinal ME voltage coefficients, $\alpha_{E,zz}$ for the bilayer of LSMO-PZT. The fields H, $\delta H$ and $\delta E$ are parallel to each other and perpendicular to the sample plane. The open (filled) circles are the data points for increasing (decreasing) H. The lines are guides to the eye.

Similar H dependence at room temperature (and 100 Hz) for the longitudinal ME voltage coefficient $\alpha_{E,zz}$ is shown in FIG. 2 for the sample with n=2. The effect is observed over a wider static field magnetic range than for the transverse case and the peak value for $\alpha_{E,zz}$ remains the same for both increasing and decreasing H. But the longitudinal coefficient is a factor of two smaller than $\alpha_{E,zx}$. Other observations of interest are the larger H-value corresponding to the maximum in $\alpha_{E,zz}$ and a smaller remanence compared to the transverse effect. The magnitude and the field dependence in FIGS. 1 and 2 are related to magnetostriction and piezomagnetic effects in LSMO and are discussed in detail in the following section.

Figure 3:
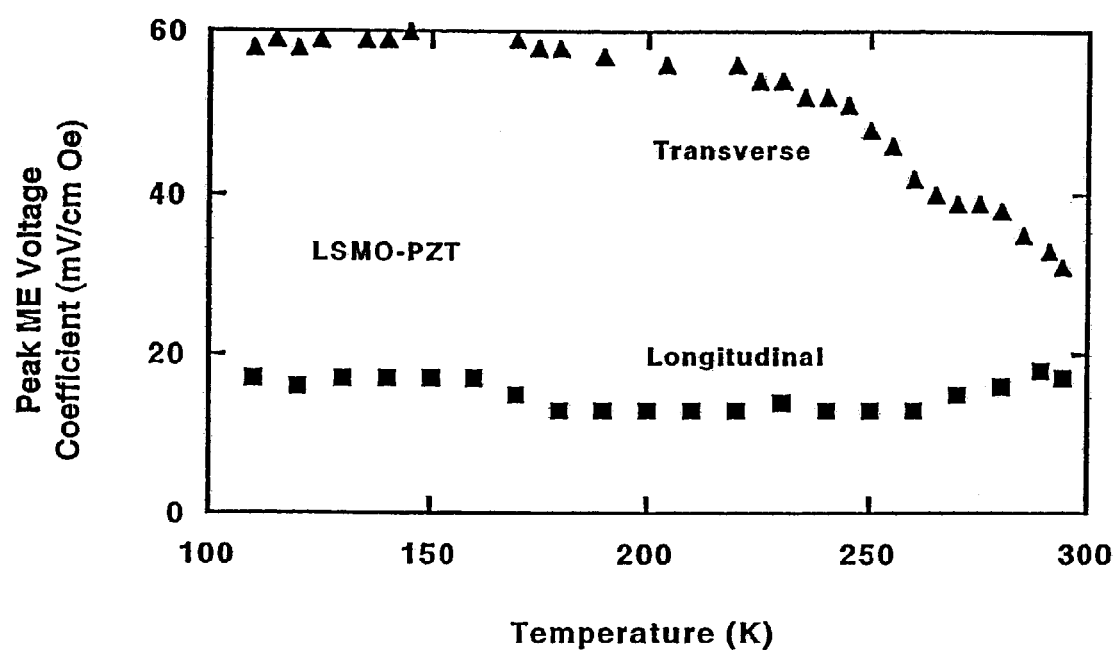
FIG. 3 is a graph showing temperature dependence of the peak transverse and longitudinal coefficients, $\alpha_{E,xz}$ and $\alpha_{E,zz}$ respectively, for the LSMO-PZT bilayer. Values of $\alpha_E$ are for the bias field H corresponding to maximum value in the ME effect. The temperature dependence is for a frequency of 100 Hz.

The variation with temperature of the ME coefficients at 100 Hz are shown in FIG. 3. The data correspond to peak values in $\alpha_E$ vs. H as in FIGS. 1 and 2 at each temperature. The longitudinal effect remains temperature independent, but the transverse coefficient shows a 50% drop over the range 200–300 K. We attribute these changes hereinafter to temperature dependence of material parameters, in particular the magnetostriction. Both low temperature and room temperature $\alpha_E$ were measured as a function of frequency from 10 Hz to 1 kHz. We observed a 10% increase in the ME coefficients when the frequency was increased from 10 Hz to 100 Hz, and then remained constant for higher frequencies. These variations are most likely due to the frequency dependence of the dielectric constant for the constituent phases and the piezoelectric coefficient for PZT.

Figure 4:
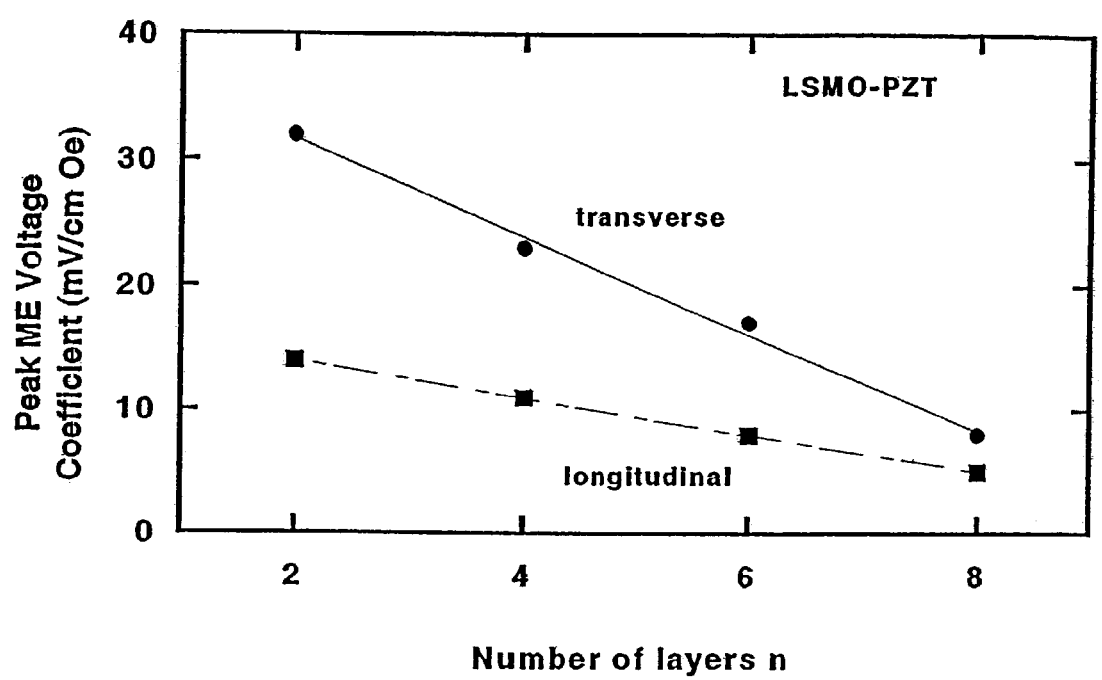
FIG. 4 is a graph showing room temperature peak ME voltage coefficients at 100 Hz as a function of total number of layers n in multilayers of LSMO-PZT. The total thickness of LSMO and PZT, 200 micron each, remained independent of n. The lines are guides to the eye.

Similar studies were carried out on LSMO-PZT multilayers with n=4–8. FIG. 4 shows data on the dependence of peak values of $\alpha_E$ as a function of n. The data at room temperature are for transverse and longitudinal field orientations and were obtained from the H-dependence as in FIGS. 1 and 2. The data show a linear decrease in $\alpha_E$, by a factor of three, when n is increase from 2 to 8. Such a large decrease in the ME parameters could only be due to effects related to composite parameters: layer thickness and area of contact at the interface. Since the effective thickness of LSMO and PZT remained the same for all samples, the thickness of the MS- and PE-phases decreases with increasing n. Further, the number of interfaces in the structure is (n−1) that increases from 1 for the bilayer to 7 for the multilayer with n=8. The observation in FIG. 4 is attributed to degradation of material parameters due to diffusion of metal ions across the p-m interface and are discussed in detail in the following section.

The most important results in studies on LSMO-PZT layered composites are as follows. (i) The ME coefficients are large at low temperatures. (ii) The transverse effect is stronger than the longitudinal counterpart. (iii) There is significant hysteresis and remanence in the H-dependence. (iv) The ME parameters are dependent sensitively on composite parameters such as the layer thickness and interface area. Although the ME effect is essentially mechanical stress mediated electromagnetic coupling, we did not observe any such effect in bulk LSMO-PZT composites because of leakage currents through low resistivity LSMO. In a bilayer, however, key factors that contribute to strong ME effects are efficient poling and the total absence of leakage currents. The largest $\alpha_E$ in LSMO-PZT composite is 60 mV/cm Oe which is three times larger than in $Cr_2O_3$, the best single phase ME material (Astrov, D. N., Soviet Phys. JETP 13, 729 (1961); Rado, G. T., et al., Phys. Rev. Lett. 7, 310 (1961); Foner, S., et al., J Appl. Phys. 34, 1246 (1963)). It compares favorably with best values for ferrite-$BaTiO_3$ bulk composites (Van den Boomgaard, J., et al., J. Mater. Sci. 9, 1705 (1974); Van den Boomgaard, J., et al., Ferroelectrics 14, 727 (1976); and Van den Boomgaard, J., et al., J. Mater. Sci. 13, 1538 (1978)), and multilayers of CFO-PZT (Harshe, G., et al., Int. Appl. Electromag. Mater. 4, 145 (1993); Avellaneda, M., et al., J. Intell. Mater. Sys. Struc. 5, 501

(1994)), and is substantially lower than reported values for PZT-Terfenol layered structures (Ryu, J., et al., Jpn. J. Appl. Phys. 40, 4948 (2001)), and nickel ferrite-PZT composites (Srinivasan, G., et al., Phys. Rev. B 64 214408 (2001)).

Figure 5:
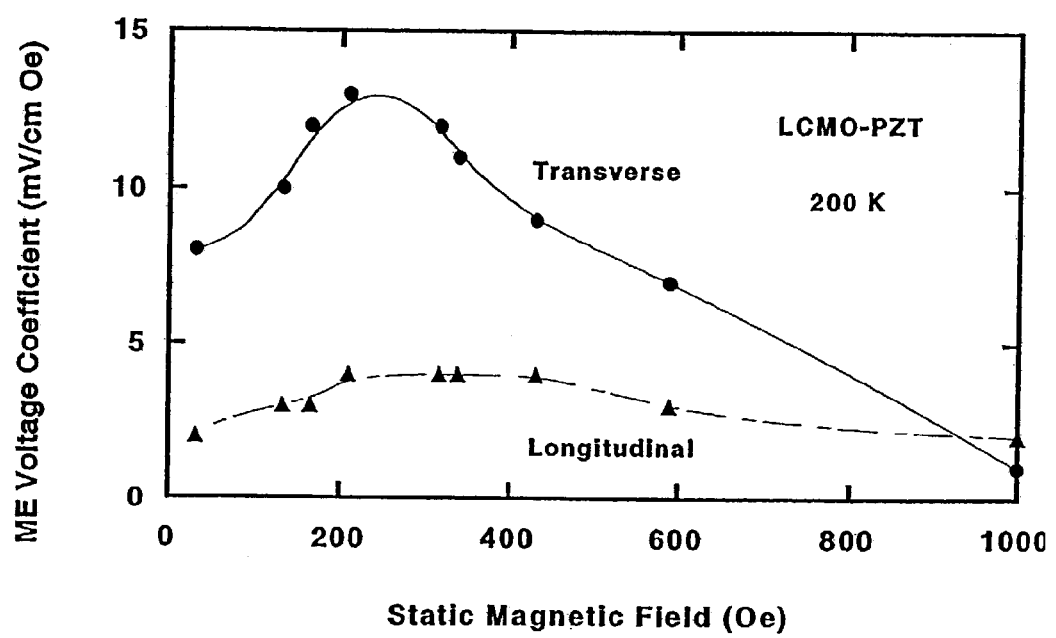
FIG. 5 is a graph showing static magnetic field dependence of transverse and longitudinal ME voltage coefficients measured at 200 K and 100 Hz for a bilayer of $La_{0.7}CA_{0.3}MnO_3$ (LCMO)-PZT. The layer thickness was 200 micron each for LCMO and PZT. The lines are guides to the eye.
Figure 6:
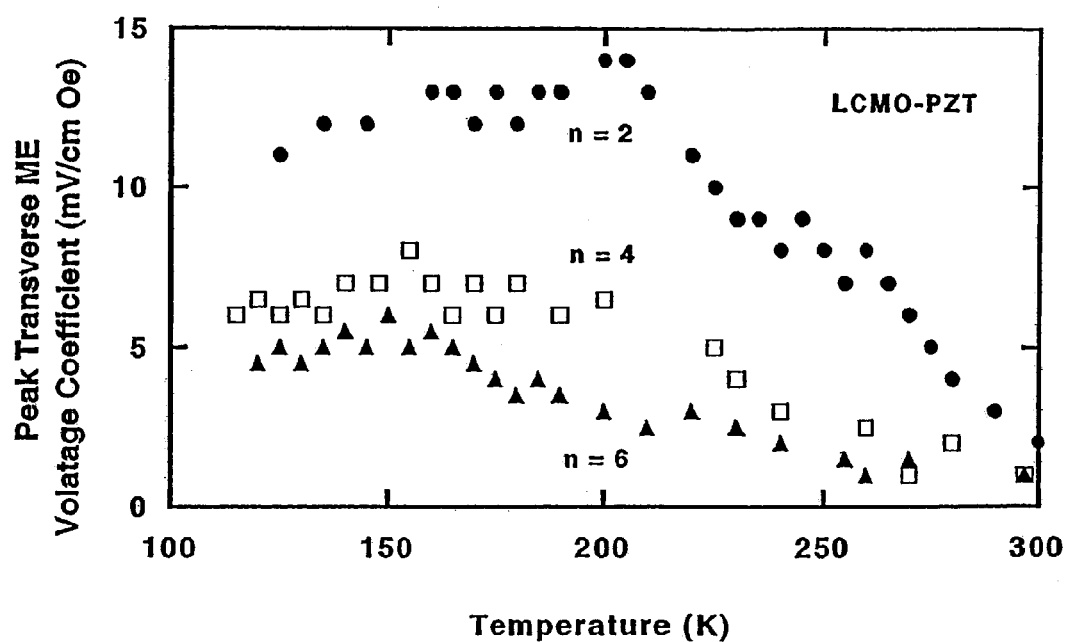
FIG. 6 is a graph showing variation of the peak transverse ME voltage coefficient at 100 Hz with temperature for bilayers (n=2) and multilayers (n=4, 6) of LCMO-PZT. The total thickness of LCMO and PZT was 200 micron each and was kept constant in all the samples.

Similar layered composites of $La_{0.7}Ca_{0.3}MnO_3$ (LCMO)-PZT were synthesized and investigated the ME properties. Bilayers and multilayers with n=4, 6 were prepared. The variation of ME voltage coefficients with the bias magnetic field is shown in FIG. 5 for a bilayer with a layer thickness of 200 μm each for LCMO and PZT. The data were obtained for a sample temperature of 200 K. The transverse coefficient peaks around 200 Oe. The longitudinal coupling is quite weak, a factor of 3–6 smaller than $\alpha_{E,zx}$. Other features in FIG. 6 are similar to the observations for LSMO-PZT in FIGS. 1 and 2. FIG. 6 shows the temperature dependence of the transverse ME voltage coefficient at 100 Hz for the composites (the longitudinal coefficients for the samples were small and remained temperature independent). Consider first the data for the bilayer that has the highest $\alpha_E$. Although the room temperature $\alpha_{E,zx}$ is small, 3 mV/cm Oe, it was observed that the ME coupling in the paramagnetic state since the Curie temperature for LCMO determined from initial susceptibility and low field magnetization is 260 K. With decreasing temperature, $\alpha_{E,zx}$ increases to a maximum value at 200 K and then stays constant at lower temperatures. In the multilayers, there is substantial weakening of the ME coupling. A 50% decrease in $\alpha_{E,zx}$ is measured for n=4 (layer thickness of 100 μm) and a further reduction is evident for n=6. The poor ME coupling in multilayers was attributed to growth-induced strain and impurities at the interface.

It is clear from the results presented in the Examples that there is a strong ME coupling in manganites-PZT layered composites. The most significant observations are (i) a relatively large transverse ME coefficient compared to the longitudinal coupling, (ii) a stronger ME coupling in LSMO-PZT than in LCMO-PZT and (iii) weakening of ME effects in multilayers. These observations are discussed and the data compared with calculated values based on the theoretical model. Consider first the anisotropy in the ME coefficient for transverse and longitudinal field orientations. According to the theory, the p- and m-layers are considered as free-bodies in a bilayer and there cannot be any strain perpendicular to the sample plane. Thus the transverse ME effect arises due to longitudinal piezomagnetic coupling ($q_{xx}$), whereas the longitudinal ME effect results from transverse piezomagnetic effects ($q_{xz}$), as in Eqs. (1) and (2). The piezomagnetic coupling q is obtained from λ vs H data, and the average q and the strength of $\alpha_E$ is dependent on the magnitude of λ. Thus any dependence of ME coefficients on field orientation results from the magnetostriction. FIG. 7 shows the bias magnetic field dependence of the longitudinal ($\lambda_{xx}$) and transverse ($\lambda_{xz}$) magnetostriction at low temperatures for LSMO and LCMO samples. The data were obtained using a strain gage on disks of bulk samples of the manganites prepared from tape-cast thick films. It is worth noting that saturation magnetostriction measurements for manganites require very high fields, on the order of 100–120 kOe (Arnold, Z., et al., Appl. Phys. Lett. 67 2875 (1995)). Since the present study is aimed at ME effects at low fields, measurements were done up to a maximum bias field of 3 kOe. For most materials $\lambda_{xx}$ is a factor of two larger than $\lambda_{xz}$. The data in FIG. 7 do indicate $\lambda_{xx}$-values that is at least a factor of two larger than $\lambda_{xz}$ and accounts for the relative magnitudes of $\alpha_{E,zx}$ and $\alpha_{E,zz}$ in LSMO-PZT (FIG. 3) and LCMO-PZT (FIG. 5). It is also evident from the data in FIG. 7 that LSMO is highly magnetostrictive compared to LCMO, leading to an enhancement in the piezomagnetic coupling and, consequently, a large $\alpha_{E,zx}$ for LSMO-PZT compared to LCMO-PZT (FIGS. 1 and 5).

Consider next the temperature dependence of ME coupling in FIGS. 3 and 6. In composites studied here, the ferroelectric Curie temperature of 663 K for PZT is higher than the ferromagnetic ordering temperature for LSMO (380 K) or LCMO (260 K). It is, therefore, reasonable to assume that changes in ME coupling with temperature are primarily due to variation in magnetic parameters, the magnetostriction in particular. Temperature dependence of λ was measured to obtain further insight into the origin of ME coupling. FIG. 8 shows the variation of $\lambda_{xx}$ and $\lambda_{xz}$ with T for LSMO and LCMO for H=3 kOe. At temperatures well below $T_c$, the magnetostriction is positive for parallel fields and is negative for directions perpendicular to the field. The mechanical deformation at low temperatures is due to Joule magnetostriction, caused by domain wall motion and domain rotation. The volume magnetostriction $\omega = \lambda_{xx} + 2\lambda_{xz}$ is quite small at low temperatures as expected. For LSMO, as the sample is warmed up, $\lambda_{xx}$ decreases above 200 K and $\lambda_{xz}$ becomes more negative, indicating a decrease in the sample volume as T approaches $T_c$. The effect, however, is dramatic in LCMO. For T>230 K, magnetostriction becomes negative for both field orientations. The magnetic field has the strongest effect on λ, and ω has the largest value for temperatures close to $T_c$ and is a measure of electron-phonon-spin coupling in the manganite. The peak in ω coincides with the ferromagnetic ordering temperatures for LCMO.

For LSMO-PZT, variation of $\alpha_{E,zx}$ with temperature (FIG. 3) essentially tracks the change in the magnitude of $\lambda_{xx}$ (FIG. 8). The 50% reduction in $\alpha_{E,zx}$ when the temperature is increased from 200 to 300 K accompanies an identical change in the magnitude of $\lambda_{xx}$. A similar character, however, is absent in the case of the longitudinal ME coupling that remains temperature independent although FIG. 8 shows a substantial increase in the magnitude of $\lambda_{xz}$ with increasing T. For LCMO-PZT, consider the variation of $\alpha_{zx}$ with T shown in FIG. 6 for the bilayer. The region of constant $\alpha_{zx}$ observed over the interval 100–200 K matches a similar character in $\lambda_{xx}$ in FIG. 8. With further increase in T, a rapid decrease is evident in $\alpha_{E,zx}$ even though we observe a sharp increase in volume magnetostriction for T close to $T_c$. Thus $\alpha_{E,zx}$ data in FIG. 6 do not provide any evidence for volume magnetostriction assisted strengthening of ME coupling in the composite. This observation needs further investigation on the role of Joule and volume magnetostriction on ME coupling.

Figure 9A:
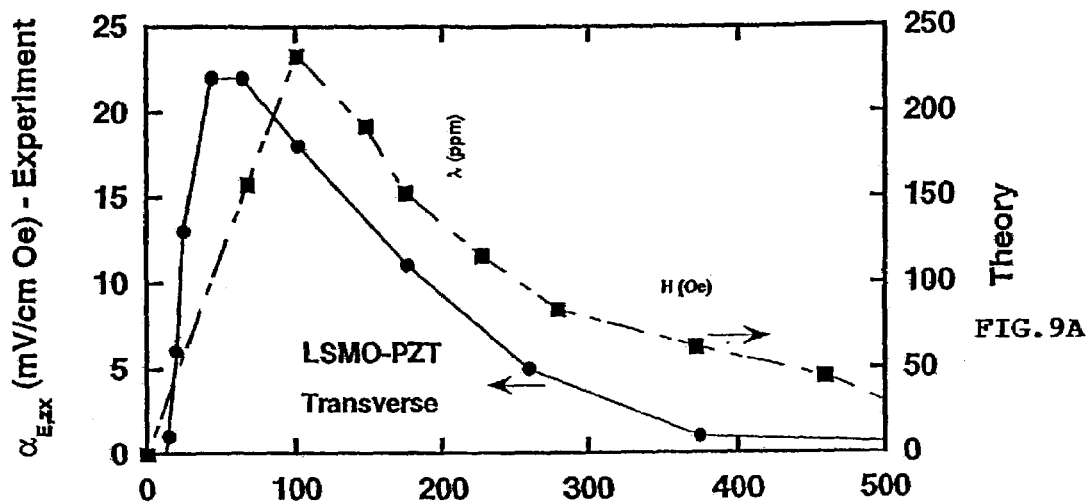
FIGS. 9A and 9B are graphs showing a comparison of theoretical ME coefficients estimated for a simple two-layer structure with the room temperature data. The circles are data points and squares are theoretical values estimated using Eqs. (1) and (2), material parameters given in the text, and the slope of magnetostriction λ vs. H.
Figure 9B:
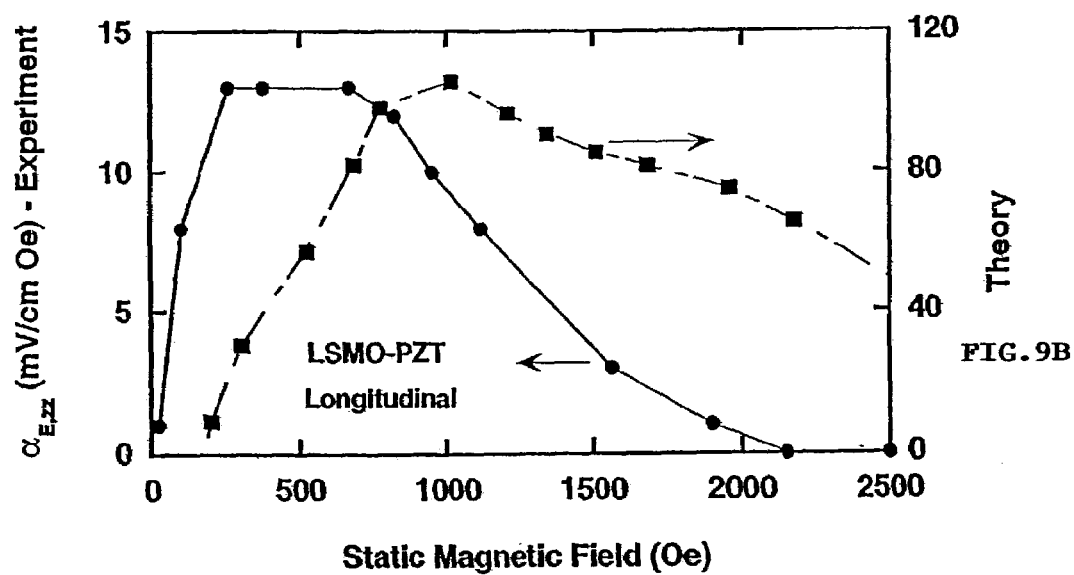
Figure 9C:
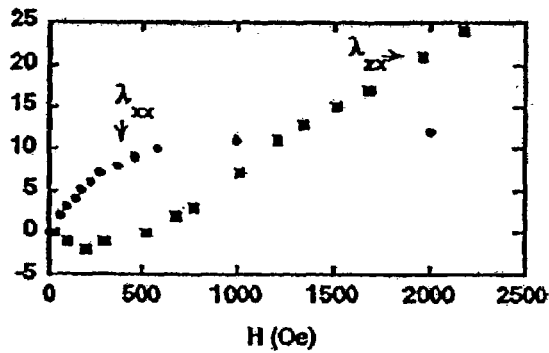
FIG. 9C shows the measured field dependence of the in-plane magnetostriction for H parallel ($\lambda_{xx}$) and perpendicular ($\lambda_{xz}$) to the plane of the multilayer composite.

Finally theoretical estimates based on the model in Section 2 with data were compared. The estimates are for the bilayer of LSMO-PZT, the sample with the strongest ME coupling in this study. It was assumed the following material parameters for the constituent phases (Harshe, G., et al., Int. J. Appl. Electromag. Mater. B 4 145 (1993); and Avellaneda, M., et al., J. Intell. Mater. Sys. Struc. 5, 501 (1994); and Piezoelectric ceramics materials properties, document code 13085, American Piezo Ceramics, Inc., Mackeyville, Pa. 1998): $^mS_{xx} = {^pS_{xx}} = 14*10^{-12}$ m²/N; $^mS_{xy} = {^pS_{xy}} = -8*10^{-12}$ m²/N; $^p\epsilon^T_{zz} = 17*10^{-9}$ F/m. Other parameters used in the calculations are the piezoelectric coupling coefficient $d_{xz}$ and the piezomagnetic coupling coefficient q. The coefficient $d_{zz}$ measured at 100 Hz for the bilayer was 120 pm/V and $d_{zx} = d_{zz}/2 = 60$ pm/V was used. The piezomagnetic coupling coefficient $q = \delta\lambda/\delta H$ was determined from data on $\lambda_{xx}$ and $\lambda_{xz}$ shown in FIG. 9 ($\lambda_{xz}$ is negative, the figure shows $-\lambda_{xz}$). Theoretical values of $\alpha_{E,zx}$ and $\alpha_{E,zz}$ were estimated using Eqs. (1) and (2) for $^mv/^Pv=1$. In FIG. 9 calculated ME voltage coefficients are compared with the room temperature data on $\alpha_E$. The data correspond to $\alpha_E$ values for increasing H in FIGS. 1 and 2. Significant findings in FIG. 9 are as follows. (i) In agreement with the data, theory predicts a peak transverse effect that is a factor of two stronger than the longitudinal effect. (ii) Theoretical values of $\alpha_E$ differ by an order of magnitude from the data. (iii) The estimated H-value corresponding to maximum in $\alpha_E$ is higher than observed experimentally. (iv) There is good qualitative agreement between theory and data for overall field dependence. The H dependence of $\alpha_E$ essentially tracks the slope of $\lambda$ vs. H. For the transverse effect, once the magnetostriction attains near saturation value, the loss of piezomagnetic coupling leads to the absence of ME effects at fields above 500 Oe. For the longitudinal effect, a substantial deviation between theory and data is seen at high fields. Theoretical $\alpha_{E,zz}$ values are large at high fields due to nonsaturation of $\lambda_{xz}$, but the measured value drops to zero for H>2 kOe.

We now discuss possible causes for the discrepancy between theory and data. Recall that the q and d parameters used for theoretical calculations are the measured values on bulk samples or on the exterior of the bilayer. Since the field conversion is an interface phenomenon, it is necessary to focus on the details of the LSMO-PZT interface for an understanding of the disagreement between theory and data. The ME coupling arises due to ac magnetic field initiated dynamic Joule magnetostriction, caused by domain wall motion and domain rotation. It is important to consider the influence of growth-induced strain at the interface and its effect on ferromagnetic order, magnetic anisotropy and the dynamics of domain motion. Detailed studies on the nature of LSMO-PZT interface is lacking at present. But, there is x-ray diffraction evidence for structural mismatch with the LSMO showing a pseudo-cubic structure (a=0.3895 nm), and a tetragonal perovskite structure (a=0.4028 nm, c=0.4149 nm) for PZT. Interface strain in films of LSMO deposited on $SrTiO_3$ and $LaAlO_3$ is observed to influence the Curie temperature and the easy direction of magnetization (Haghiri-Gosnet, A. M., et al., J. Appl. Phys. 88 4257 (2000)).

One must also consider the effects of interface defects, inhomogeneities, and grain boundaries that pin the domains and limit wall motion and rotation. Magnetic force microscopy studies on LCMO show evidence for domain pinning by surface defects (Chen, C.-C., et al., Appl. Phys. A 66, S1181 (1998)). As we mentioned earlier, degradation of magnetic parameters in samples sintered above 1350 K indicates diffusion of metal ions across the LSMO-PZT boundary and the formation of chemical inhomogeneities and defects. Even though the samples in the present Examples (sintered at 1325 K) showed expected values for magnetic parameters, presence of impurities due to diffusion at the interface cannot be totally ruled out. Additional evidence for the interface diffusion was obtained from studies on multilayer samples. Data on the variation of ME voltage coefficients with the number of layers n in FIG. 4 for LSMO-PZT and in FIG. 6 for LCMO-PZT show a sharp drop in $\alpha_E$ with n. Increase in the number of layers affects the composite parameters in two ways: a decrease in the layer thickness and an increase in the interface area. Thus the data for multilayers are clear indicators of diffusion of metal ions between manganites and PZT and the subsequent degradation of magnetic and piezoelectric parameters for the composite. In summary, the observed order of magnitude difference in theoretical and experimental ME coefficients is most likely related to deviations from bulk values of material parameters at the interface. Investigations on the LSMO-PZT interface with techniques such as electron microscopy and magnetic force microcopy are critically important for an understanding of the current observations.

Thick film bilayers of lanthanum strontium manganite-PZT prepared by tape casting techniques show magnetoelectric effects as strong as in ferrite-PZT multilayer composites. The largest effect is observed for transverse orientation of electric and magnetic fields and at low temperatures. A theoretical model that assumes ideal interface conditions accounts qualitatively for the field dependence of ME parameters. We anticipate considerable future activities related to the physics and chemistry of manganite-PZT interface and possible use of the composites in memory devices and as sensors.

The unique property of the composites is the memory effects in LSMO-PZT. In any event potential applications are: smart sensors (detection of magnetic fields by measuring the electrical voltage produced); sensors (for measurements of rotation speed, linear speed or acceleration (mainly automotive); read-head (in storage devices: (converts "bits in magnetic storage devices" to electrical signal. For example, read-heads need to produce at least a signal of 10 mV, which the composites of this invention can do). The composites easily meet such requirements; and storage media: (magneto-electric media to store information).

The LSMO-PZT composites show low conversion efficiencies, but a large remanence (a memory effect that is useful for information storage). The materials can be used for magnetoelectric memory devices, electrically controlled magnetic devices, magnetically controlled piezoelectric devices, and smart sensors.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

I claim:

1. A poled magnetoelectric laminate composite comprising in combination:
   (a) a layer of a piezoelectric composition; and
   (b) a layer of a sintered $La_{1-n}A_nMnO_3$ magnetostrictive composition where A is selected from the group consisting of calcium, strontium and mixtures thereof and n is a number less than 1, wherein the layer of the magnetostrictive composition has been separately cast as a film of submicron powders and then the film has been compressed and sintered together with the layer of the piezoelectric composition.

2. The composite of claim 1 wherein A is strontium.

3. The composite of claim 1 wherein A is calcium.

4. A memory device comprising a poled magnetoelectric laminate composite comprising as the memory device:
   (a) a layer of a piezoelectric composition; and
   (b) a layer of a sintered $La_{1-n}A_nMnO_3$ magnetostrictive composition where A is selected from the group consisting of calcium, strontium and mixtures thereof and n is a number less than 1, wherein the layer of the magnetostrictive composition has been separately cast as a film of sintered submicron powders and then the film has been compressed and sintered together with the layer of the piezoelectric composition.

5. The memory device of claim 4 wherein the magnetostrictive composition is $La_{0.7}Sr_{0.3}MnO_2$.

6. The memory device of claim 4 wherein the magnetostrictive composite is $La_{0.7}Ca_{0.3}Mn_2$.

7. The memory device of any one of claim 4, 5 or 6 wherein the piezoelectric material comprises lead zirconate titanate.

8. A system requiring a laminate sensor combining magnetic and magnetoelectric properties comprising as the sensor a poled magnetoelectric composite of:
(a) a layer of a piezoelectric composition; and
(b) a layer of a sintered $La_{1-n}A_n MnO_3$ magnetostrictive composition where A is selected from the group consisting of calcium, strontium and mixtures thereof and n is a number less than 1, wherein the layer of the magnetostrictive composition has been separately cast as a film of sintered submicron powders and then the film has been compressed and sintered together with the layer of the piezoelectric composition.

9. The system of claim 8 wherein the magnetostrictive composite is $La_{0.7}Sr_{0.3}MnO_2$.

10. The system of claim 8 wherein the magnetostrictive composite is $La_{0.7}Ca_{0.3}MnO_2$.

11. The composite of claim 1 wherein there are 2, 4, 6 or 8 of the layer of (a) and (b) together.

12. The device of claim 4 wherein there are 2, 4, 6 or 8 of the layer of (a) and (b) together.

13. The system of claim 8 wherein there are 2, 4, 6, or 8 of the layer of (a) and (b) together.

* * * * *

UNITED STATES PATENT AND TRADEMARK OFFICE
CERTIFICATE OF CORRECTION

PATENT NO. : 7,226,666 B2
APPLICATION NO. : 10/354863
DATED : June 5, 2007
INVENTOR(S) : Gopalan Srinivasan It is certified that error appears in the above-identified patent and that said Letters Patent is hereby corrected as shown below:

Column 1, line 24, "calium" should be --calcium--.

Column 6, line 58, "ethly alcohol" should be --ethyl alcohol--.

Signed and Sealed this

Thirteenth Day of November, 2007

JON W. DUDAS
*Director of the United States Patent and Trademark Office*